United States Patent
Rosenberg et al.

(10) Patent No.: US 11,088,479 B2
(45) Date of Patent: Aug. 10, 2021

(54) SOCKETS INCLUDING WICKING REGIONS MOUNTED ON A SYSTEM BOARD

(71) Applicant: Hewlett Packard Enterprise Development LP, Houston, TX (US)

(72) Inventors: Paul Kessler Rosenberg, Sunnyvale, CA (US); Kent Devenport, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/082,271

(22) PCT Filed: Apr. 25, 2016

(86) PCT No.: PCT/US2016/029130
§ 371 (c)(1),
(2) Date: Sep. 5, 2018

(87) PCT Pub. No.: WO2017/188919
PCT Pub. Date: Nov. 2, 2017

(65) Prior Publication Data
US 2019/0074617 A1    Mar. 7, 2019

(51) Int. Cl.
*H01R 12/71*    (2011.01)
*H05K 3/30*    (2006.01)
*H01R 13/52*    (2006.01)
*H01R 12/70*    (2011.01)

(52) U.S. Cl.
CPC ......... *H01R 12/718* (2013.01); *H01R 12/716* (2013.01); *H01R 13/5202* (2013.01); *H05K 3/305* (2013.01); *H01R 12/707* (2013.01); *H05K 2201/10325* (2013.01); *Y02P 70/50* (2015.11)

(58) Field of Classification Search
CPC .......... H05K 3/202–337; H05K 7/1067–1039; H05K 3/30; H01R 12/71; H01R 12/718
USPC .................................. 361/767–778, 801–802
See application file for complete search history.

(56) References Cited

U.S. PATENT DOCUMENTS

| 3,704,515 A | 12/1972 | Nelson | |
| 4,220,383 A * | 9/1980 | Scheingold | .......... H05K 7/1069 439/331 |
| 4,550,959 A * | 11/1985 | Grabbe | .................. H05K 3/303 29/843 |

(Continued)

FOREIGN PATENT DOCUMENTS

| EP | 0696092 A2 | 2/1996 |
| EP | 1231016 | 8/2002 |

(Continued)

OTHER PUBLICATIONS

GPD Global Process; "Encapsulation"; (Web Page) Dam & Fill—Glob Top; Feb. 12, 2006; 4 pages; available at http://www.gpd-global.com/co_website/pdf/Dam_and_Fill_Analyis.pdf.

(Continued)

*Primary Examiner* — Tuan T Dinh
(74) *Attorney, Agent, or Firm* — Sheppard Mullin Richter & Hampton LLP

(57) ABSTRACT

An example device in accordance with an aspect of the present disclosure includes a base to be mounted to a system board. A wicking region at the base is to wick adhesive into the wicking region to seal the base to the system board.

13 Claims, 6 Drawing Sheets

(56) References Cited

U.S. PATENT DOCUMENTS

| | | | | |
|---|---|---|---|---|
| 4,682,829 A | * | 7/1987 | Kunkle | H05K 7/1038 29/840 |
| 5,567,177 A | * | 10/1996 | Foerstel | H05K 7/1023 206/724 |
| 5,576,937 A | * | 11/1996 | Kubo | G01R 1/0433 174/17 CT |
| 5,772,451 A | * | 6/1998 | Dozier, II | G01R 1/07314 439/70 |
| 5,802,699 A | * | 9/1998 | Fjelstad | H01L 23/49827 29/593 |
| 5,833,471 A | * | 11/1998 | Selna | H05K 3/325 439/73 |
| 6,238,237 B1 | | 5/2001 | Nagahata et al. | |
| 6,632,024 B2 | | 10/2003 | Kawase et al. | |
| 6,785,148 B1 | | 8/2004 | Ishida et al. | |
| 7,025,600 B2 | * | 4/2006 | Higashi | H01R 13/2407 439/66 |
| 7,179,093 B2 | * | 2/2007 | Holmberg | H05K 7/1061 439/331 |
| 7,274,094 B2 | * | 9/2007 | Boon | H01L 31/0203 257/433 |
| 8,374,470 B2 | * | 2/2013 | Ban | G02B 6/43 385/49 |
| 8,668,499 B2 | * | 3/2014 | Takahashi | H01R 12/721 439/61 |
| 9,097,866 B2 | | 8/2015 | Wu | |
| 2004/0127075 A1 | | 7/2004 | Yoshida | |
| 2005/0018972 A1 | | 1/2005 | Anderson et al. | |
| 2005/0121806 A1 | | 6/2005 | Sangiorgi | |
| 2005/0178815 A1 | | 8/2005 | Blood | |
| 2007/0173130 A1 | * | 7/2007 | Hashiguchi | H01R 13/2442 439/660 |
| 2009/0268423 A1 | | 10/2009 | Sakurai et al. | |
| 2010/0327879 A1 | * | 12/2010 | Yasuzawa | G01R 31/2889 324/537 |
| 2011/0300746 A1 | | 12/2011 | Ihara | |
| 2012/0268155 A1 | * | 10/2012 | Rathburn | G01R 31/2889 324/756.02 |
| 2013/0170164 A1 | | 7/2013 | Luan et al. | |
| 2015/0293318 A1 | | 10/2015 | Droesbeke et al. | |

FOREIGN PATENT DOCUMENTS

| | | |
|---|---|---|
| JP | 2006-318726 | 11/2006 |
| JP | 2008-234914 | 10/2008 |
| JP | 2011-258364 | 12/2011 |
| KR | 10-1200502 | 11/2012 |

OTHER PUBLICATIONS

Stack Exchange; "What Kind of Glue Should I Use for PCB-mounted components to avoid vibrations?"; (Research Paper); Electrical Engineering; Aug. 22, 2011; 4 pages.

Extended European Search Report Received for EP Patent Application No. 16895737.1, dated Oct. 15, 2018, 11 pages.

International Search Report and Written Opinion received for PCT Application No. PCT/US2016/029130, dated Jan. 24, 2017, 7 pages.

* cited by examiner

SOCKETS INCLUDING WICKING REGIONS MOUNTED ON A SYSTEM BOARD

BACKGROUND

Optical and electrical devices can involve complex circuitry that is interconnected for high-speed communication. Such circuitry can occupy space on an electrical substrate/system board. Usage and availability of system board space can affect quality and speed of communication between circuit elements.

BRIEF DESCRIPTION OF THE DRAWINGS/FIGURES

DETAILED DESCRIPTION

Circuit board assemblies may contain one or more connectors/sockets for attaching cables that supply electrical power or communication channels for data input and output. Sockets can be attached using screws, glue, solder, and so on. Forces of several pounds or more may be experienced by the sockets, e.g., through cables attached to the sockets. The attachment of such sockets can consume valuable space on the system board, and can cause circuit components to be spaced further apart from each other, degrading the speed and/or reliability of communication between circuit elements.

To address such issues, examples described herein may use a socket that includes a wicking region for adhesive. In this manner, examples described herein may place circuit elements together to enhance speed and quality of circuit communications, and achieve other benefits (such as reduced power and manufacturing costs, etc.). An optical socket can be attached using adhesive to bond the socket to the electrical substrate/system board. The combination of adhesive type, geometry of the system, and socket design enable the wicking region of the socket to achieve a "smart glue" effect whereby adhesive is wicked under the socket where needed to achieve a high-strength bond and dust/moisture seal while conforming to irregular shapes/dimensions of the socket. The socket is thereby attached using very little space on the system board, enabling a connectorizable optical system while accommodating the constraints of optical circuitry communication by achieving close proximity placement of different circuit elements. The wicking region of the socket allows adhesive to be dispensed using a "top-down dispense" approach supporting high-volume production equipment. Adhesive can be distributed and wicked to the entire perimeter of a complex shape (e.g., socket perimeter including extensions, contours, windows, and the like). A sealed perimeter around the socket is created, preventing entry of contaminants to components associated with the socket.

Figure 1:
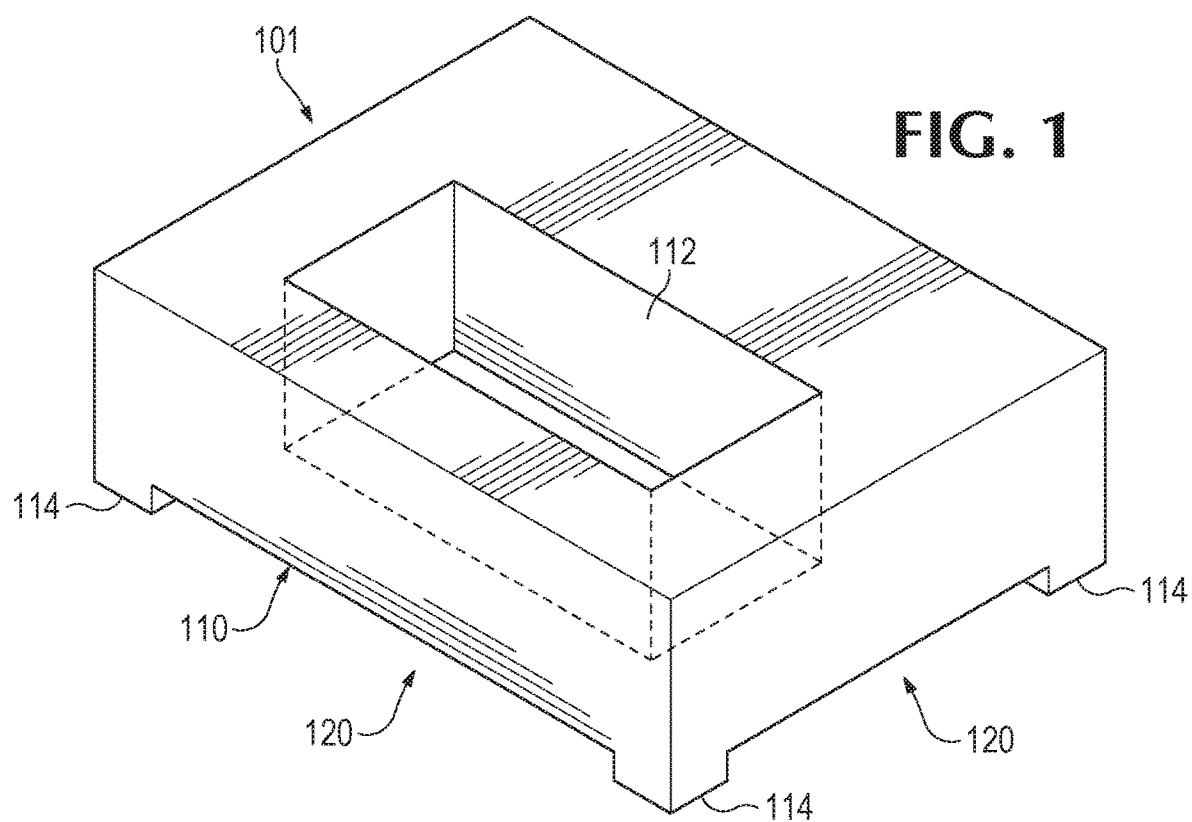
FIG. 1 is a side perspective view of a socket including a wicking region according to an example.

FIG. 1 is a side perspective view of a socket 101 including a wicking region 120 according to an example. The socket includes a base 110 to be mounted to a system board. A window 112 is disposed in the base 110. At least one protrusion 114 extends from the base 110 of the socket 101, to establish the wicking region 120 at the base 110. The wicking region 120 extends around the window 112 along a perimeter of the base 110 to wick adhesive into the wicking region 120 to seal the perimeter of the base 110 around the window 112.

The socket 101 provides a receptacle for receiving an attachable/detachable connector, such as a cable or optical ferrule. The socket 101 may be formed of various materials suitable for receiving a connector, such as plastic, metal, and the like. In an example implementation, the socket 101 may be formed of high temperature plastic having a melting point sufficiently high to withstand exposure to solder reflow temperatures (e.g., temperatures on the order of 260 degrees Centigrade). The socket 101 can precisely, accurately, and reliably align, e.g., an optical cable/ferrule to optical components on an electrical substrate/system board. Accordingly, unlike other approaches that glue or permanently fix an optical component such as a pigtail to a system board due to the need to maintain precise optical alignment, example implementations described herein can secure the socket 101 while allowing for a connectorized component (e.g., optical ferrule) that can be precisely inserted/removed many times from the socket 101 to align with an optical component (e.g., optical emitters/receivers) underlying the socket 101.

The socket 101 is to be spaced from a system board (not shown in FIG. 1, see FIG. 3) on which it is to be mounted. In the illustrated example implementation, the protrusions 114 are formed as part of the socket 101 and can serve as standoffs/feet to precisely space the base 110 from the system board. In alternate example implementations, the socket 101 can omit the protrusions 114, and instead use a tacking adhesive and/or careful positioning of the socket 101 during assembly to establish spacing between the base 110 and the system board. For example, a socket 101 without protrusions 114 can be positioned within a range of distances from the system board, and ultraviolet (UV) cured adhesive can be used to tack the socket 101 into place to introduce the desired gap for establishing the wicking region 120 (i.e., a cured first adhesive can serve as the protrusions 114, and a second adhesive can be wicked past the first adhesive under the socket to seal the socket to the system board). The wicking region 120 formed thereby is compatible with the characteristics of the adhesive and the geometry of the underside of the socket, to cause the adhesive to be drawn under the socket 101 to form a dust/moisture seal in a perimeter formation to protect an enclosed chip area beneath the socket 101. The adhesives/bonding agents used herein can include those with varying cure times such as fast, medium, and/or slow curing, and agents that are cured based on various approaches such as thermally cured, catalytically cured, optically cured, and so on. The enclosed chip area inside the window 112 is left uncovered/not encapsulated by the adhesive, due to the characteristics of the wicking region 120 that retain the adhesive where desired away from the window 112. The adhesive can thereby be applied in a first region separate from the wicking region 120, and the adhesive will be wetted/wicked/pulled into the wicking region 120 underneath the socket 101 to create a perimeter seal and a large, high-strength bonding area between the socket 101 and the system board.

The seal and strong bond can be achieved without needing a continuous bead of adhesive dispensed carefully around the entire perimeter of the socket 101. Rather, the wicking region 120 can achieve an unbroken dust/moisture seal around a perimeter of the socket 101 and/or window 112 by dispensing adhesive in one or more separate regions, by wicking the adhesive to naturally fill the wicking region 120. In an example implementation, adhesive can be dispensed in a top-down dispense approach, beside the socket 101 (e.g., in 3 regions/locations on the system board corresponding to a front and sides of the socket). The adhesive can pool on the system board and move laterally to come in contact with the socket 101, and be drawn under the socket 101 by wetting characteristics/wicking/capillary action due to the wicking region 120, such that very little/no adhesive remains on the system board where initially dispensed. A dam can be used to contain the adhesive, but is not needed, and therefore the system board layout can be made more compact. Unlike a dam-and-fill approach, the dam is not needed and the adhesive does not need to fill a height corresponding to the dam, because wicking draws the adhesive where needed. Similarly, the example wicking region 120 approach is unlike a globbing/glob-top approach (whose glob adhesive would be too viscous/thick to properly wick), because the example adhesive is able to spread laterally and wick under the socket 101. Accordingly, the socket 101 enables compact systems associated with mid-board optics, e.g., enabling the placement of an optical transceiver inside a communication device (e.g., server box, switch, router, etc.), avoiding a need for longer electrical communication routes. For example, a first chip (e.g., transceiver) can be placed next to a second chip for short distance interoperability, without needing to space the chips further apart to accommodate a dam or other space-consuming socket-fastening approach.

Figure 2:
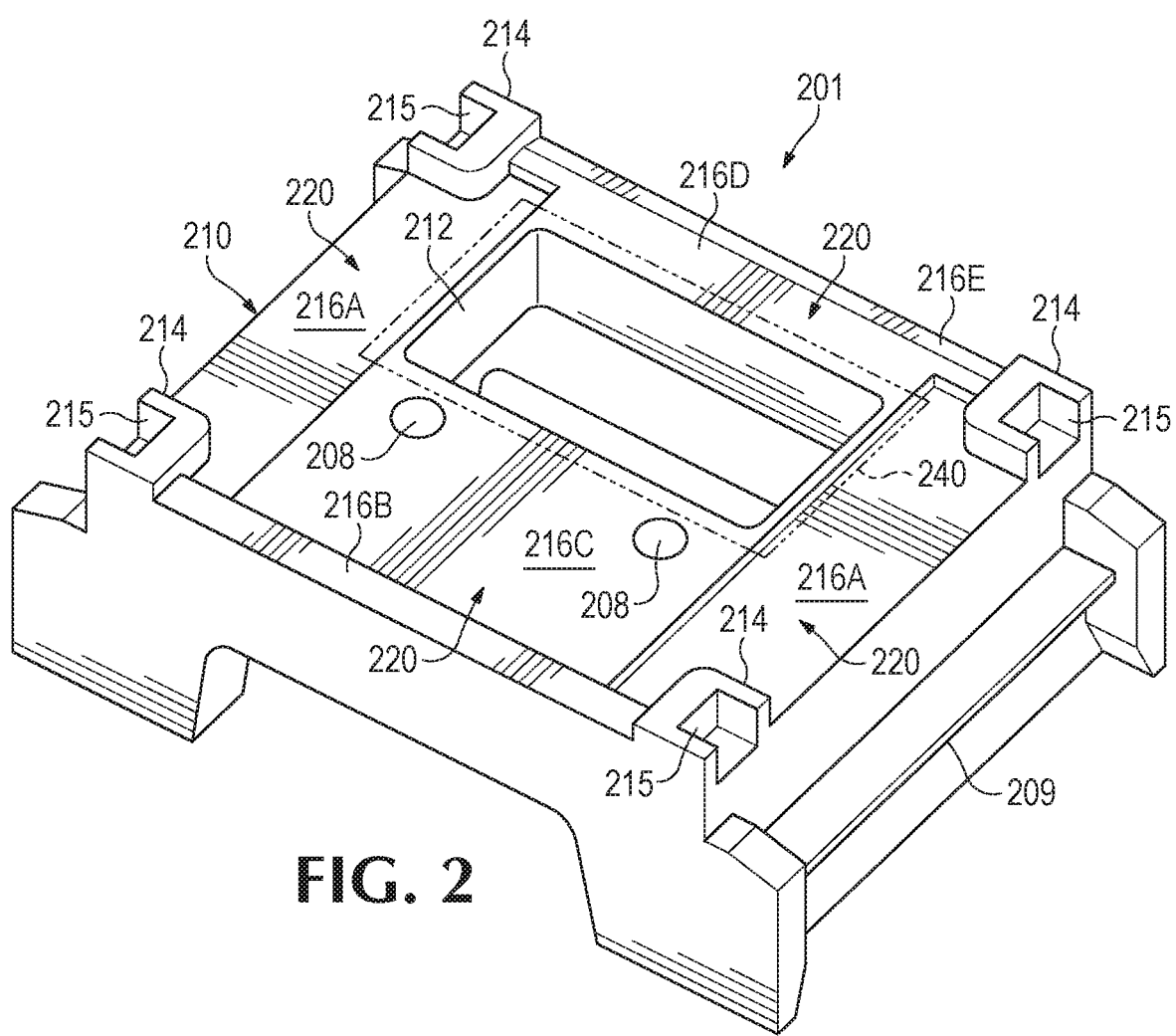
FIG. 2 is a bottom perspective view of a socket including a wicking region according to an example.

FIG. 2 is a bottom perspective view of a socket 201 including a wicking region 220 according to an example. The socket 201 also includes a base 210, window 212, protrusions 214, guide holes 208, and overhangs 209. The wicking region 220 is based on varied geometry, including a plurality of hollows 216A, 216B, 216C, 216D, and 216E. The wicking region 220 enables adhesive to form a seal 240 around the perimeter of the window 212, despite the adhesive being dispensed away from the base 210 due to overhangs 209. The base 210 is spaced from the system board by protrusions 214. A protrusion 214 can include a recess 215, to receive a first adhesive used to tack the socket 201 into place. The at least one overhang 209 extends laterally from a surface of the socket 201 away from the base 210. The guide hole(s) 208 are disposed in the base 210 to align the socket 201 relative to the system board.

In an example, the socket 201 includes a plurality of recesses 215 to receive a first adhesive, such as a UV cured adhesive, to tack the socket 201 into place on a system board for precisely aligning the socket 201 for optical operations prior to receiving the second adhesive, such as a fill adhesive, to be wicked into the wicking region 220 for a high strength bond. The wicking region 220 is at least in part based on a geometry of the base 210. For example, the hollows 216A-216E are disposed in the base 210 to provide separation between at least a portion of the base 210 and the system board, providing enhanced wicking of the adhesive under the socket 201. The geometry of the wicking region 220 also can be affected at least in part by the at least one protrusions 214 extending from the base 210 of the socket 201, to provide separation between the base 210 and the system board to which the socket 201 is mounted. In an example implementation, the protrusions 214 are nominally approximately on the order of 400 microns tall, to set the gap height for the wicking region 220. For example, the gap height between the underlying system board and illustrated hollows 216C and 216D can be substantially equal to the height established by the protrusions 214, whereas the gap heights between the system board and hollows 216A, 216B, and 216E can vary. As shown, the hollows can include varying profiles, such as the sloped shape of hollow 216E and the flat shape of the hollows 216A.

A quantity of adhesive to be dispensed at one or more adhesive dispense regions (not shown in FIG. 2, see FIG. 3) on the system board substantially corresponds to a volume of the wicking region 220, because the adhesive is wicked from the adhesive dispense region(s) under the socket 201 to form the seal 240 around the window 212 by substantially filling the wicking region 220. This also enables complex shapes for the adhesive to migrate into, along the lateral axes as well as along a height axis. Accordingly, the adhesive is to have proper flow characteristics to flow into the desired shape of the wicking region 220 (i.e., adhesive characteristics less viscous than glob-top adhesive). Additionally, the adhesive provides good bond strength to reliably attach the socket 201 to the substrate/system board, in view of withstanding forces experienced via cables and connectors to be connected to the socket 201. The adhesive also has the ability to withstand solder reflow exposure conditions (e.g., 260 degrees C. for 30 seconds), and has a reasonable coefficient of thermal expansion (CTE) match to the socket 201 and/or system board, with an acceptable cost.

The socket 201, and corresponding wicking region 220, can be dimensioned to have a geometry and/or gap(s) from the system board (e.g., 200-400 microns) to accommodate the viscosity and flow characteristics of a given adhesive, whose characteristics also provide desirable lateral spreading of the adhesive to migrate from the adhesive dispense region to under the socket 201 into the wicking region 220. The specific dimensions of the wicking region 220 can vary while still remaining compatible. For example, a change in five microns will not substantially affect wicking, and the dimensions can be varied by, e.g., within a 200 micron variation from a nominal gap of 400 microns. Adhesive waste can be avoided by not dispensing too much adhesive, by adjusting the dispense amount to accommodate the empty volume of the wicking region 220 geometry and gap between the base 210 and the system board.

Figure 3:
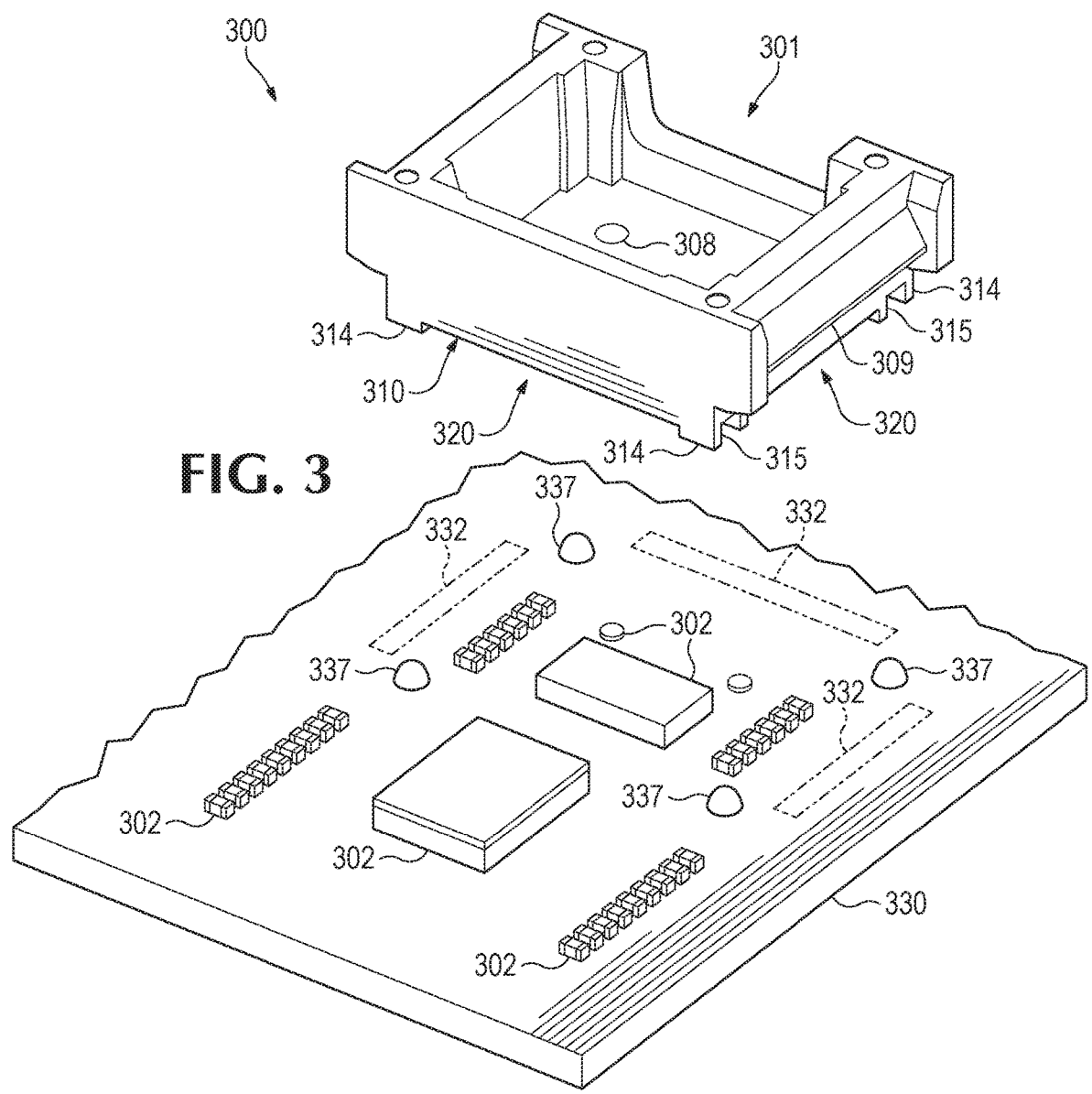
FIG. 3 is a side perspective view of a system including a socket and a system board according to an example.

FIG. 3 is a side perspective view of a system 300 including a socket 301 and a system board 330 according to an example. The socket 301 is to be mounted to the system board 330 to establish the wicking region 320 between a base 310 of the socket 301 and the system board 330. The wicking region 320 is to wick adhesive from the system board 330 into the wicking region 320. Adhesive dispensed on the system board 330 (e.g., at adhesive dispense region(s) 332) and wicked into the wicking region 320 can establish a seal between the socket 301 and the system board 330 along a perimeter of the base 310. The various system board components 302 can be placed in close proximity to each other on the system board 330, without a need to make room between components 302 that might otherwise be needed to accommodate other less compact types of fastening approaches.

The wicking region 320 enables a seal to be formed to protect and surround one of the components 302 (e.g., based on a window in the base, not visible in FIG. 3), while allowing components 302 to be placed very close together. The wicking region 320 can keep the adhesive away from some components, although other components (such as the small surface-mounted passive capacitor components 302) can be allowed to become encapsulated by the adhesive when wicked from the adhesive dispense regions 332 to the wicking region 320. Such encapsulation can be provided as an incidental effect and can be desired, as the wicking of the adhesive is primarily to provide perimeter sealing and adhesive strength, and/or to keep the adhesive away from the component within the socket window.

The socket 301 can be various dimensions. In an example implementation, the socket 301 has a footprint of 8.7 mm×10.3 mm. The socket 301 can align and secure an optical connector in position relative to an optic chip component 302 positioned within the footprint of the socket 301 to be received at the window of the socket base. The socket 301 initially can be held in place by drops of UV cured adhesive 337 placed at the corners of the socket (aligned for recesses 315 of the socket protrusions 314), in a process referred to as tacking. Although tacking is sufficient to hold the socket 301 in place, a much stronger bond is desirable to secure the socket for long-term use, provided by wicking region 320 to receive the adhesive that is to be dispensed to adhesive dispense regions 332 and wicked under the socket 301 into the wicking region 320.

The adhesive dispense regions 332 are shown positioned on the system board 330 to either side of the socket, as well as at a free space at the back of the socket 301. Such adhesive dispense regions 332 can be used as space is available. For example, the space between the larger chip system components 302 is not used for an adhesive dispense region, because those chips are placed close together. An adhesive dispense region can be omitted and a remaining region(s) can be used to provide sufficient adhesive, e.g., if system board space is at more of a premium than the illustrated example system have three available spaces for the adhesive dispense regions 332. The adhesive will spread and wick itself under the socket from the perimeter of the socket 301. The adhesive in the adhesive dispense regions 332 flows out and expands until a portion touches the socket 301 and is drawn underneath. A quantity of adhesive dispensed onto the system board 330 corresponds to a volume of the wicking region 320. The adhesive dispense regions 332 can be relatively small in lateral surface area, compared to the total lateral area of the wicking region 320 where the adhesive will eventually end up. The wicking region 320 enables the adhesive to conform to complex shapes/contours, despite being dispensed into the basic shapes of the adhesive dispense regions 332. Wicking by the wicking region 320 pulls the adhesive underneath the entirety of the socket 301, while preventing the adhesive from contacting the optoelectronic components 302 or guide holes 308 (which can remain free of fill adhesive). In an example implementation, the guide holes 308 or other portions can be blocked, e.g., by applying a strip of tape (Kapton tape) to the base of the socket 301 at the holes 308, or by fabricating the socket so that the bottom of the holes is closed off, i.e., a blind hole, by using a thin layer of socket material, to further seal out the adhesive.

The adhesive material can be various types of adhesives having compatible characteristics corresponding to wicking by the wicking region 320. Some example adhesives include Henkel FP 4450/70, Hysol UF 8830, and Eccobond 1325LV. Such adhesives have characteristics to wick and serve as fill material for the wicking region 320, having desirable flow characteristics and other characteristics to endure subsequent exposure to solder reflow process and provide a good CTE match to the socket, silicon, and other substrate materials/components that the adhesive will come in contact with.

The wicking region 320 can be established by tacking the socket into place using UV cured adhesive 337, to provide separation between the base 310 of the socket and the system board 330. This separation can be achieved by the protrusions 314 of the socket 301 establishing the gap, or by using the tacking adhesive 337 (e.g., in alternate examples where the socket 301 has a base 310 without protrusions 314) and an assembly technique that sets the desired gap between the base and system board when tacking with the first adhesive.

As illustrated, additional components 302 (such as application specific integrated circuits (ASICs) and passives (capacitors, resistors, etc.)) are located in the immediate area where the socket 301 is to be placed. Thus, components 302 can be co-packaged to move the socket 301 very close to the components 302. The system board 330 can be an electrical substrate of different sizes. In an example implementation, the system board 330 is 25 mm×25 mm in area, although other dimensions are possible. The complex external lateral socket geometry (e.g., including the overhangs 309) is also visible, which would otherwise pose challenges for dispensing adhesive around the base of the irregularly shaped socket 301 underlying the overhands 309. In the illustrated example implementation, overhangs 309 are latch rails that project out laterally from sides of the socket 301 and further limit access to the perimeter of the base 310 of the socket 301. Thus, the overhangs 309 block top-down dispense of adhesive at the base 310, which would otherwise need the system board 330 to be tilted approximately 45 degrees one way or the other for dispensing the adhesive at the base, which would be a challenging process in a high-volume production environment. Accordingly, use of the adhesive dispense regions 332 and the wicking region 320 avoids such difficulties and allows sealing the socket 301 while using efficient top-down adhesive dispensing.

In alternate example implementations, a dam-and-fill adhesive can be used to bond the socket 301 to the system board 330. First, a relatively narrow material 'dam' can be constructed by dispensing a continuous bead of viscous material/adhesive around an area of interest that at least includes the footprint of the wicking region 320. This dam can then be filled by dispensing a second material/adhesive into the dam to produce a volume of desired height. While the dam material is viscous and thixotropic, the fill has relatively lower viscosity and is designed to flow and fill the dam to a level height. The fill material volume can be set to fill up the wicking region 320. The maximum fill material volume to be dispensed can be set (e.g., as the geometric volume of the wicking region 320) so as to avoid overflowing the region around the component(s) within the window of the socket 301.

Figure 4:
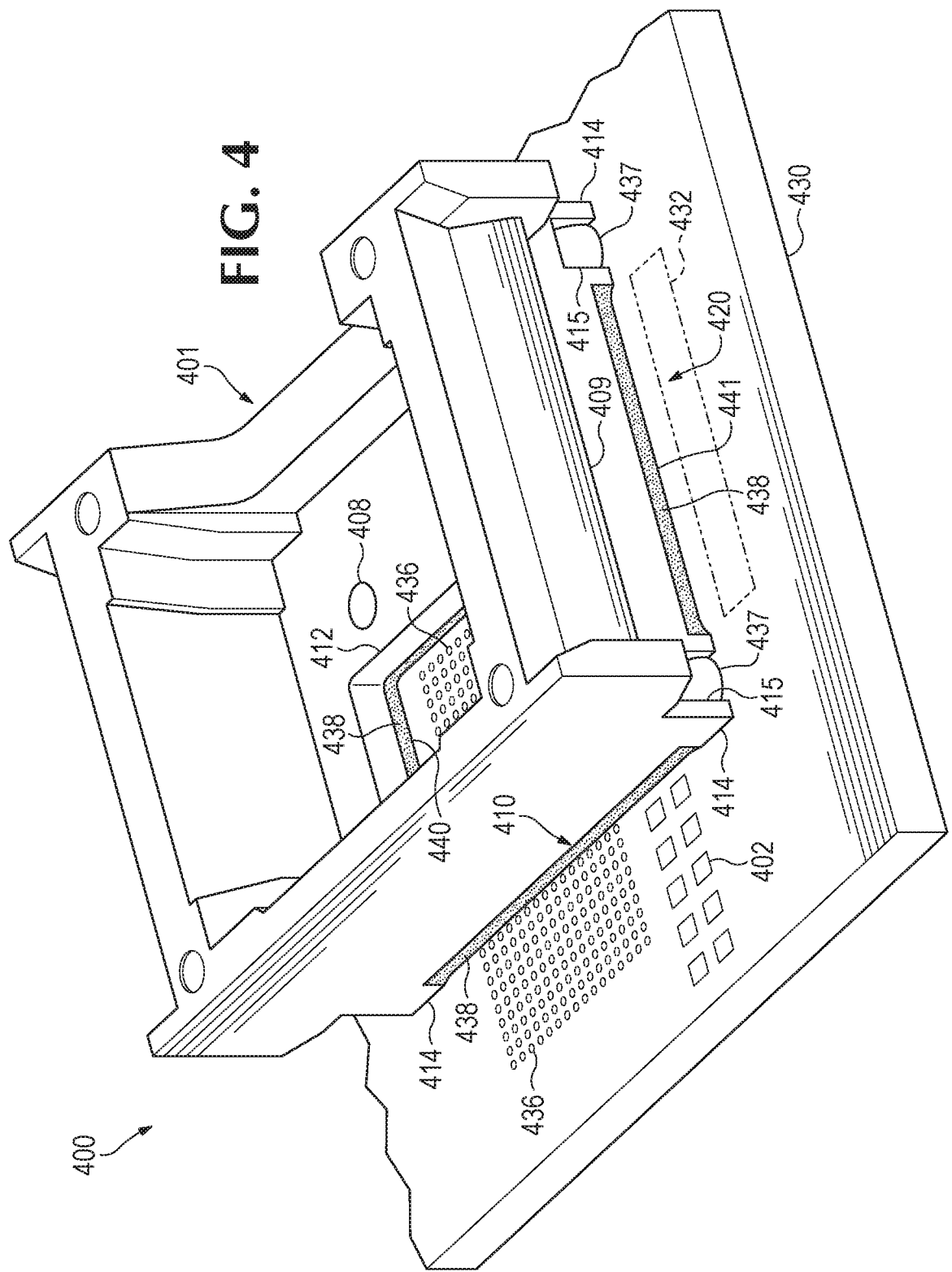
FIG. 4 is a side perspective view of a system including a socket, adhesive, and a system board according to an example.

FIG. 4 is a side perspective view of a system 400 including a socket 401, adhesive 438, and a system board 430 according to an example. The socket 401 also includes a window 412 and guide hole(s) 408 in the base 401. The system board 430 includes component attachment pads 402 (corresponding components not shown attached in FIG. 4), and also includes at least one contact 436 disposed inside the window 412. The wicking region 420 is shaped to cause the adhesive 438 to be wicked from the adhesive dispense regions 432 into the wicking region 420, to establish the seal 440 around the window 412 without the adhesive 438 intruding onto the at least one contact 436. The socket 401 is shown with protrusions 414 having recesses 415 that are filled with UV cured adhesive 437. Overhangs 409 of the socket 401 extend laterally away from the socket 401 toward the adhesive dispense regions 432.

The system board 430 can be treated (e.g., by mechanical patterning or chemical treatment) at or around the adhesive dispense region 432 to affect wettability between the adhesive 438 and the system board 430, e.g., to repel adhesive and/or encourage/enhance wicking of the adhesive 438 to the wicking region 420. The socket 401 can similarly be treated, to attract adhesive away from the adhesive dispense regions 432. Additionally, areas on the system board 430 under the socket can be treated to affect wettability for increasing bonding of the adhesive to the system board 430, e.g., in locations where the adhesive will be located after wicking under the socket 401 to bond the socket 401 to the system board 430.

The socket 401 can be attached to the system board, by tacking the socket 401 into place on the system board to establish the wicking region 420 between the base 410 of the socket 401 and the system board 430. For example, the socket can be tacked into place at a plurality of recesses 415 on the socket 401 using UV cured adhesive 437. Then, the fill adhesive 438 can be dispensed onto at least one dispensing region 432 of the system board 430 beside the socket 401. The adhesive 438 then wicks from the dispensing region 432 into the wicking region 420, to establish a seal between the socket 401 and the system board 430 along a perimeter of the base 410 of the socket 401, and/or along a perimeter of the window 412.

More specifically, when the adhesive 438 is dispensed, it spreads laterally from the adhesive dispense region 432. The adhesive 438 then contacts the edge of the socket base 410, the wicking region 420 pulls the adhesive 438 underneath the socket 401. Within a footprint of the socket 401, the wicking region 420 continues to pull the adhesive 438 to the front of the socket 401 and throughout the interior of the footprint of the wicking region 420/base 410, providing a good seal around the window 412 (into which the adhesive is not pulled). After the adhesive 438 wicks into the wicking region 420, substantially none of the adhesive remains in the adhesive dispense region(s) 432. Accordingly, the adhesive can provide a good bond strength between the socket 401 and the system board 430. For example, the wicking region of the example socket can provide adhesive at an attach area of about 100 mm$^2$, which can withstand approximately 10-20 pounds of force in a tensile test pulling the socket 401 straight up from the system board 430.

Figure 5:
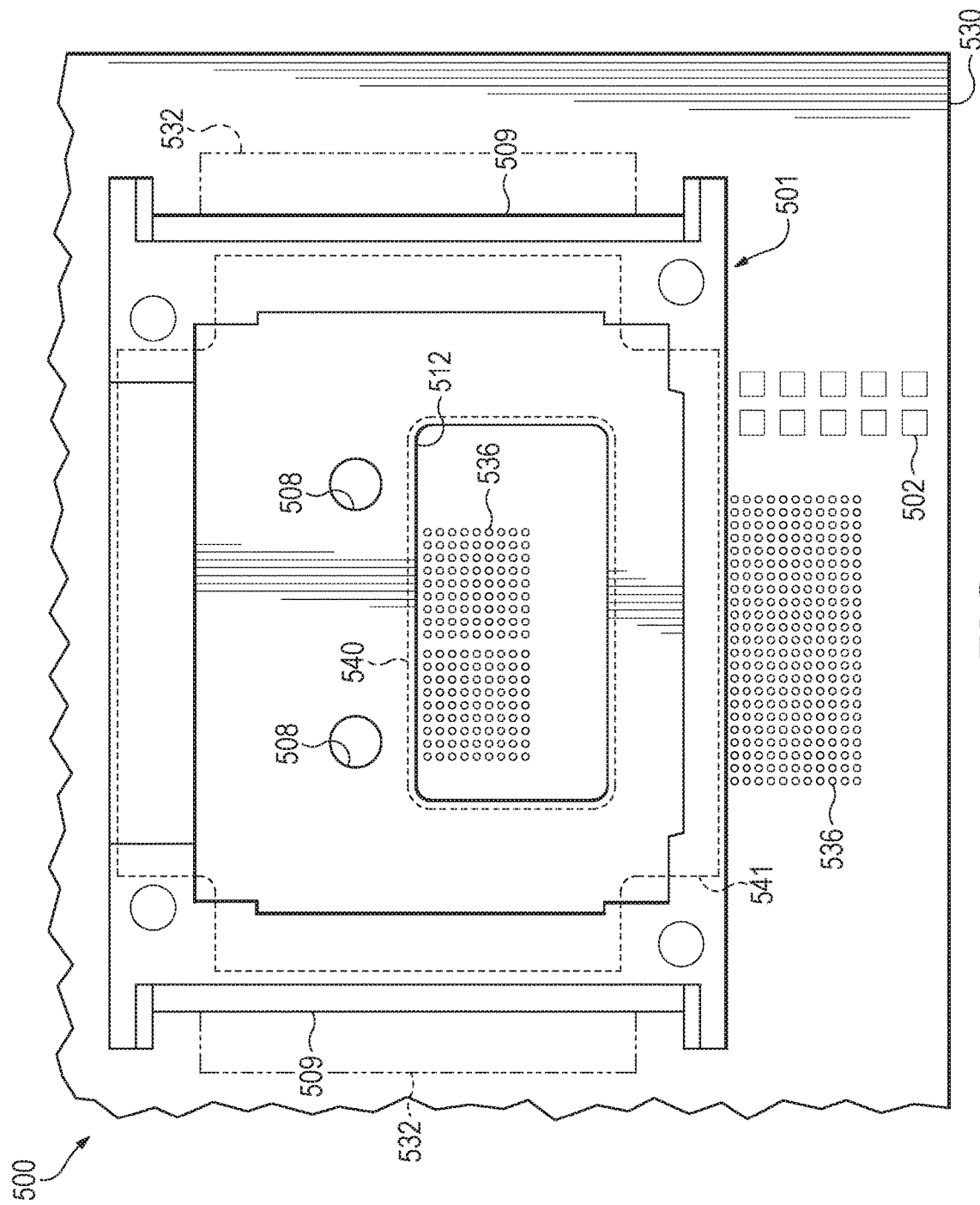
FIG. 5 is a top view of a system including a socket and a system board according to an example.

FIG. 5 is a top view of a system 500 including a socket 501 and a system board 530 according to an example. The socket 501 includes overhangs 509, guide holes 508, and window 512. The system board includes contacts 536 and adhesive dispense regions 532. The at least one overhang 509 prevents the at least one adhesive dispense region 532 from being positioned in contact with a base of the socket 501 for top-down dispense of the adhesive 538 into the at least one adhesive dispense region 532. However, the wicking region can wick the adhesive from the laterally spaced adhesive dispense regions 532 under the socket 501, to form a first seal 541 around a perimeter of the base of the socket, and a second seal 540 around the window 512 in the base of the socket. As illustrated, the adhesive and seals can accommodate varying/irregular shapes and contours, e.g., by sealing around the example protrusions tacked to the system board at the corners of the base.

Figure 6:
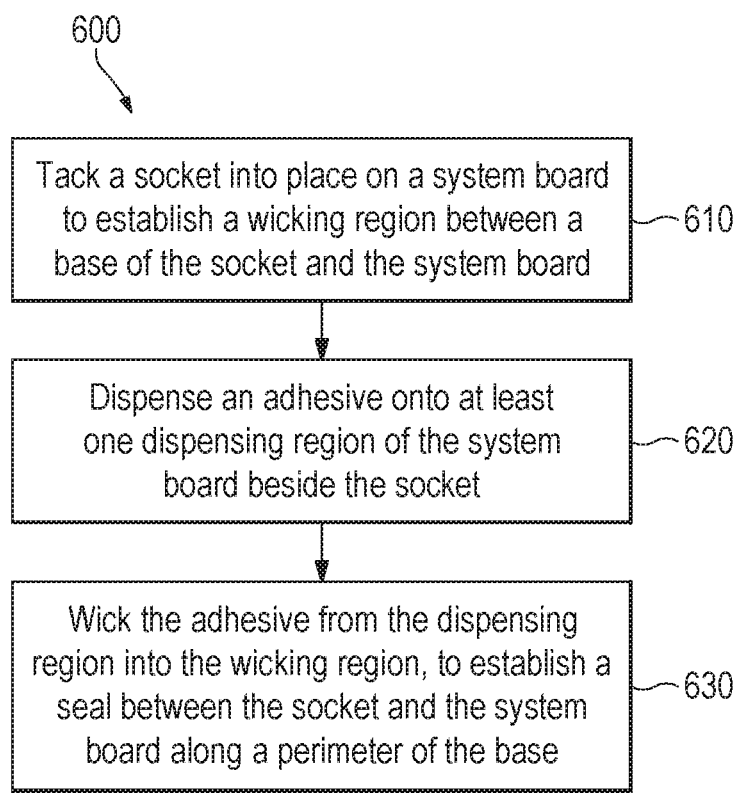
FIG. 6 is a flow chart based on establishing a seal between a socket and a system board according to an example.

Referring to FIG. 6, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 6 is a flow chart 600 based on establishing a seal between a socket and a system board according to an example. In block 610, a socket is tacked into place on a system board to establish a wicking region between a base of the socket and the system board. For example, UV cured adhesive can be used at corners of the socket to precisely align and hold the socket relative to optical components on the system board, establishing a gap between the base of the socket and the system board to receive fill adhesive that can wick around the UV cured adhesive. In block 620, an adhesive is dispensed onto at least one dispensing region of the system board beside the socket. For example, adhesive can be dispensed using a top-down dispense technique along some of the edges of the socket, spaced from the socket due to socket overhangs extending laterally away from the base/footprint of the socket. In block 630, the adhesive is wicked from the dispensing region into the wicking region, to establish a seal between the socket and the system board along a perimeter of the base. For example, the adhesive spreads under capillary action/gravity until it contacts the socket and is wicked under the socket, conforming to the socket window and other geometric variations without needing to use difficult adhesive dispensing approaches.

What is claimed is:

1. A system, comprising:
   a system board including at least one of: a contact or an optic chip component;
   a socket mounted to the system board to establish a wicking region between a base of the socket and the system board, wherein the wicking region is to wick adhesive from the system board into the wicking region, the wicking region comprising a space between a surface of the system board and a plurality of hollows disposed in the base of the socket;
   an adhesive dispensed on the system board and wicked into the wicking region to establish a seal between the socket and the system board along a perimeter of the base and to bond the system board and socket together; and
   a window in the base, wherein at least a portion of the window extends through the base completely such that the at least one contact or the at least one optic chip component is disposed inside the window,
   wherein the plurality of hollows and the base are monolithically formed and the adhesive is wicked into the space between the surface of the system board and the monolithically formed plurality of hollows to establish the seal between the socket and the system board along the perimeter of the base and to bond the system board and socket together.

2. The system of claim 1, wherein at least one contact is disposed inside the window, and wherein the wicking region is shaped to cause the adhesive to establish the seal around the window without the adhesive intruding onto the at least one contact.

3. The system of claim 1, wherein the wicking region is based on tacking the socket into place using a rapid curing bonding agent.

4. The system of claim 1, wherein the wicking region is based on a geometry of the base including at least one hollow disposed in the base to provide separation between at least a portion of the base and the system board.

5. The system of claim 1, wherein the wicking region is based on at least one protrusion extending from the base of the socket to provide separation between the base and the system board.

6. The system of claim 1, wherein a quantity of adhesive dispensed onto the system board corresponds to a volume of the wicking region.

7. The system of claim 1, wherein the system board is treated at an adhesive dispense region to affect wettability of the adhesive to the system board to encourage wicking of the adhesive into the wicking region and increase bond strength of the adhesive to the system board.

8. The system of claim 1, wherein at least one hollow of the plurality of hollows having a geometry different from one or more other hollows.

9. The system of claim 1, wherein at least one hollow of the plurality of hollows comprising a slope shape.

10. The system of claim 1, wherein the at least one optic chip component is disposed inside the window, and wherein the wicking region is shaped to cause the adhesive to establish the seal around the window without the adhesive intruding onto the at least one optic chip component.

11. The system of claim 3, wherein the rapid curing bonding agent is at least one of i) an ultraviolet (UV) cured adhesive, and ii) solder.

12. The system of claim 3, wherein the socket further comprises a plurality of recesses to receive the rapid curing bonding agent to tack the socket into place.

13. The system of claim 3, wherein the rapid curing bonding agent is to tack the socket into place to provide separation between the base and the system board.

* * * * *